(12) United States Patent
Sunwoo et al.

(10) Patent No.: US 11,627,679 B2
(45) Date of Patent: Apr. 11, 2023

(54) FLEXIBLE COVER WINDOW AND METHOD OF MANUFACTURING THE SAME

(71) Applicant: UTI INC., Chungcheongnam-do (KR)

(72) Inventors: Kukhyun Sunwoo, Gyeonggi-do (KR); Tea Joo Ha, Chungcheongnam-do (KR); Jong In Park, Gyeonggi-do (KR); Jung Seok Woo, Chungcheongnam-do (KR)

(73) Assignee: UTI INC.

( * ) Notice: Subject to any disclaimer, the term of this patent is extended or adjusted under 35 U.S.C. 154(b) by 144 days.

(21) Appl. No.: 17/172,941

(22) Filed: Feb. 10, 2021

(65) Prior Publication Data
US 2021/0315116 A1     Oct. 7, 2021

(30) Foreign Application Priority Data

Apr. 2, 2020 (KR) .................. 10-2020-0040137

(51) Int. Cl.
*B32B 3/30* (2006.01)
*H05K 5/03* (2006.01)
(Continued)

(52) U.S. Cl.
CPC ............ *H05K 5/03* (2013.01); *B32B 3/30* (2013.01); *B32B 17/10064* (2013.01);
(Continued)

(58) Field of Classification Search
CPC ...... G09F 9/301; G06F 1/1641; G06F 1/1652; G02F 1/133331; H05K 5/03; B32B 3/26;
(Continued)

(56) References Cited

U.S. PATENT DOCUMENTS

| 2018/0136371 A1* | 5/2018 | Kim | ................ B32B 27/06 |
| 2018/0217639 A1* | 8/2018 | Jones | .............. G06F 1/1652 |
| 2019/0081255 A1* | 3/2019 | Kim | ............... B32B 27/308 |

FOREIGN PATENT DOCUMENTS

| KR | 20170122554 A | * 11/2017 |
| KR | 20180093649 | * 8/2018 |

(Continued)

OTHER PUBLICATIONS

Translation of KR 20170122554. Obtained from EPO global dossier. (Year: 2017).*

(Continued)

*Primary Examiner* — Megha M Gaitonde
(74) *Attorney, Agent, or Firm* — Mendelsohn Dunleavy, P.C.

(57) ABSTRACT

Disclosed are a flexible cover window and a method of manufacturing the same. A glass-based flexible cover window includes planar portions formed so as to correspond to planar regions of a flexible display and a folding portion formed so as to be connected to the planar portions, the folding portion being formed so as to correspond to a folding region of the flexible display, the folding portion having a smaller thickness than each of the planar portions, wherein the flexible cover window includes a glass substrate and a shock compensation pattern unit formed on the glass substrate, the shock compensation pattern unit is formed at each of the planar portions and the folding portion, and the shock compensation pattern unit has cylindrical patterns.

33 Claims, 10 Drawing Sheets

(51) Int. Cl.
*B32B 17/10* (2006.01)
*C03C 15/00* (2006.01)
*C03C 21/00* (2006.01)

(52) U.S. Cl.
CPC .. *B32B 17/10073* (2013.01); *B32B 17/10137* (2013.01); *B32B 17/10981* (2013.01); *C03C 15/00* (2013.01); *C03C 21/00* (2013.01); *B32B 2255/10* (2013.01); *B32B 2307/412* (2013.01); *B32B 2457/20* (2013.01)

(58) Field of Classification Search
CPC ..... B32B 3/263; B32B 3/30; B32B 17/10018; B32B 17/10137; B32B 2255/10; B32B 2255/28; B32B 2307/412; B32B 2457/20; B32B 3/08; B32B 3/085; B32B 2307/558; B32B 2307/56; C03C 17/32; C03C 15/00; C03C 21/00; Y10T 428/24174; Y10T 428/24479; Y10T 428/24521; Y10T 428/24612; Y10T 428/2462; Y10T 428/24942; Y10T 428/2495
USPC ........ 428/119, 156, 161, 172, 173, 212, 213
See application file for complete search history.

(56) References Cited

FOREIGN PATENT DOCUMENTS

| KR | 1020180093649 A | 8/2018 |
|----|----|----|
| KR | 102068729 B1 | 1/2020 |

OTHER PUBLICATIONS

Translation of KR 20180093649. Obtained from EPO global dossier. (Year: 2018).*

* cited by examiner

FLEXIBLE COVER WINDOW AND METHOD OF MANUFACTURING THE SAME

CROSS-REFERENCE TO RELATED APPLICATION

This application claims priority from Korean Patent Application No. 10-2020-0040137, filed on Apr. 2, 2020, in the Korean Intellectual Property Office, the disclosure of which is incorporated herein by reference in its entirety.

BACKGROUND OF THE INVENTION

1. Field of the Invention

The present invention relates to a flexible cover window, and more particularly to a flexible cover window having a shock compensation pattern unit formed on a glass substrate in order to improve the surface of the flexible cover window and to disperse shock, whereby strength and folding properties of the flexible cover window are secured.

2. Description of the Related Art

With recent rapid development of electric and electronic technologies and an increase in new demands of the times and various demands of consumers, various types of display products have been manufactured. Thereamong, research on a flexible display capable of being folded and unfolded has been actively conducted.

In the first place, research on folding the flexible display was conducted, and now research on rolling and stretching the flexible display are being conducted. Not only a display panel but also a cover window configured to protect the display panel must be flexible.

Such a flexible cover window must be basically flexible and must have no wrinkles at the folding region thereof after repeated folding, and image distortion must not occur.

For a conventional cover window for flexible displays, a polymer film, such as a PI film or a PET film, is attached to the surface of a display panel.

Since the mechanical strength of the polymer film is low, however, the polymer film serves merely to prevent scratches on the display panel. In addition, the polymer film has low resistance to shock and low transmittance. Furthermore, the polymer film is relatively expensive.

As the number of folds of the display increases, the folding region of the polymer film is wrinkled, whereby the folding region of the polymer film is damaged. For example, the polymer film is pressed or torn at the time of folding limit evaluation (generally 200,000 times).

In recent years, various research on a glass-based cover window has been conducted in order to overcome the limit of the polymer film cover window.

Such a glass-based cover window requires fundamental physical properties. For example, image distortion must not occur, and the glass-based cover window must have sufficient strength with respect to repetitive contact of a touch pen and specific pressure while folding properties must be satisfied.

In order to satisfy the strength properties of the cover window, glass must have a specific thickness or more. In order to satisfy the folding properties of the cover window, on the other hand, the glass must have a specific thickness or less. Consequently, research on the optimum thickness and structure of the cover window at which image distortion does not occur while both the strength properties and the folding properties are satisfied is necessary.

Also, in the case in which the glass has a specific thickness or less, inherent texture of a reinforced glass is deteriorated, which must also be considered.

Therefore, there is a need for technology capable of providing a cover window having an appropriate thickness necessary to secure strength and at the same time satisfying folding properties while maintaining inherent texture of the reinforced glass.

In the case in which thin glass is used, however, a process for removing scratches from the surface of the glass is very difficult and troublesome. As a result, it is difficult to provide a high-quality cover window.

SUMMARY OF THE INVENTION

The present invention has been made in view of the above problems, and it is an object of the present invention to provide a flexible cover window having a shock compensation pattern unit formed on a glass substrate in order to improve the surface of the flexible cover window and to disperse shock, whereby strength and folding properties of the flexible cover window are secured.

In accordance with an aspect of the present invention, the above and other objects can be accomplished by the provision of a glass-based flexible cover window including planar portions formed so as to correspond to planar regions of a flexible display and a folding portion formed so as to be connected to the planar portions, the folding portion being formed so as to correspond to a folding region of the flexible display, the folding portion having a smaller thickness than each of the planar portions, wherein the flexible cover window includes a glass substrate and a shock compensation pattern unit formed on the glass substrate, the shock compensation pattern unit is formed at each of the planar portions and the folding portion, and the shock compensation pattern unit has cylindrical patterns.

In accordance with another aspect of the present invention, there is provided a method of manufacturing a glass-based flexible cover window including planar portions formed so as to correspond to planar regions of a flexible display and a folding portion formed so as to be connected to the planar portions, the folding portion being formed so as to correspond to a folding region of the flexible display, the folding portion having a smaller thickness than each of the planar portions, the method including a first step of forming a resist layer on a glass substrate, a second step of patterning the resist layer to form a resist pattern layer for formation of a first pattern on the entire surface or a folding region of the glass substrate, a third step of performing a primary etching process using the resist pattern layer of the second step as a mask to form a first pattern on the entire surface or the folding region of the glass substrate and removing the resist pattern layer, a fourth step of forming a resist layer on the glass substrate having the first pattern formed thereon, a fifth step of patterning the resist layer to form a resist pattern layer for formation of a second pattern on the folding region or to form a resist pattern layer for formation of a second pattern on the folding region and for formation of a third pattern on planar regions of the glass substrate, a sixth step of performing a secondary etching process using the resist pattern layer of the fifth step as a mask to further etch the folding region, thereby forming a second pattern at the folding region, or to etch the entire surface of the glass substrate, thereby forming a second pattern at the folding region and forming a third pattern at the planar regions, and removing the resist pattern layer, and a seventh step of strengthening the glass substrate, whereby a shock compensation pattern unit is formed at the folding portion and the planar portions.

The size of each of the patterns of the shock compensation pattern unit may be 0.08 to 0.15 mm, and the distance between the patterns may be 0.05 to 0.12 mm.

The shock compensation pattern unit may be formed at one surface or opposite surfaces of the glass substrate.

The height of each of the patterns of the shock compensation pattern unit formed at the folding portion may be less than the depth of the folding portion.

The shock compensation pattern unit may be realized through an etching process.

The etching process may include a primary etching process of forming a first pattern at the entire surface of the glass substrate and a secondary etching process of further etching the folding region to form a second pattern, the shock compensation pattern unit formed at the folding portion may be realized by the second pattern, and the shock compensation pattern unit formed at each of the planar portions may be realized by the first pattern.

Alternatively, the etching process may include a primary etching process of forming a first pattern at the folding portion and a secondary etching process of etching the entire surface of the glass substrate to form a second pattern at the first pattern region as the result of further etching of the first pattern and to form a third pattern at each of the planar portions, the shock compensation pattern unit formed at the folding portion may be realized by the second pattern, and the shock compensation pattern unit formed at each of the planar portions may be realized by the third pattern.

The etching depth according to the primary etching process may be 0.0005 to 0.28 mm, and the etching depth according to the secondary etching process may be 0.01 to 0.2 mm.

The folding portion may have an inclined portion formed at the border with each of the planar portions.

The patterns of the shock compensation pattern unit may be regularly or irregularly formed so as to have an identical size or different sizes.

The patterns of the shock compensation pattern unit may be realized so as to have a lattice array or a cross array.

Pattern density of the shock compensation pattern unit formed at the folding portion and pattern density of the shock compensation pattern unit formed at each of the planar portions may be equal to each other, or pattern density of the shock compensation pattern unit formed at the folding portion may be higher than pattern density of the shock compensation pattern unit formed at each of the planar portions.

The flexible cover window may further include a shock-absorbing resin layer formed at the front surface of the glass substrate, at which the shock compensation pattern unit is formed, and a cover glass substrate formed on the shock-absorbing resin layer.

The patterns of the shock compensation pattern unit may be filled with a transparent resin material.

A transparent resin layer may be formed on the transparent resin material above the shock compensation pattern unit, and the transparent resin material and the transparent resin layer may be successively formed through an identical process using an identical material, or the transparent resin material and the transparent resin layer may be successively formed through sequential processes using an identical material or different materials.

The transparent resin layer may be formed at the front surface and the rear surface of the glass substrate or at the front surface, the rear surface, and the entire side surface of the glass substrate.

The transparent resin layer formed at the rear surface of the glass substrate and the transparent resin layer formed at the front surface of the glass substrate may be made of an identical material, or the transparent resin layer formed at the rear surface of the glass substrate may be made of a softer material than the transparent resin layer formed at the front surface of the glass substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

The present invention relates to a flexible cover window, and more particularly to a flexible cover window having a shock compensation pattern unit formed on a glass substrate in order to reduce scratches and to disperse shock, whereby strength and folding properties of the flexible cover window are secured.

That is, the shock compensation pattern unit is formed at a folding portion and planar portions of the glass substrate, whereby scratch percentage is reduced, and at the time of shock, such as pen drop, the shock is dispersed between patterns to improve resistance to pen drop, and therefore strength properties and folding properties are simultaneously satisfied.

Hereinafter, the present invention will be described in detail with reference to the accompanying drawings.

Figure 1A:
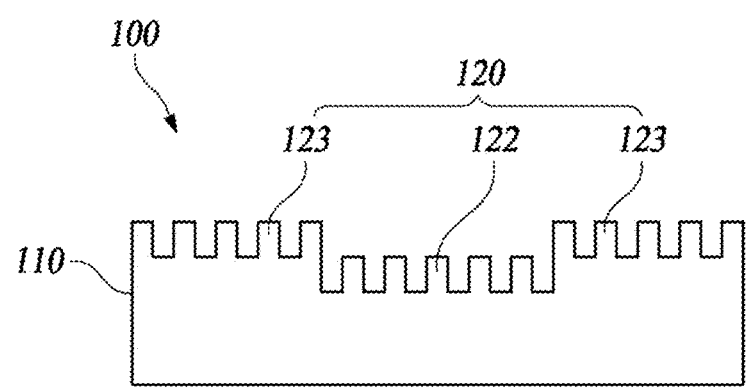
FIG. 1A is a sectional view schematically showing the case in which a shock compensation pattern unit is formed at one surface of a glass substrate in accordance with an embodiment of the present invention.
Figure 1B:
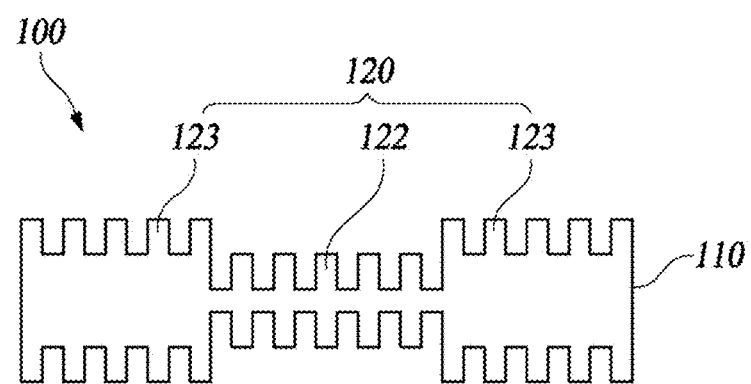
FIG. 1B is a sectional view schematically showing the case in which a shock compensation pattern unit is formed at opposite surfaces of a glass substrate in accordance with an embodiment of the present invention.
Figure 2A:
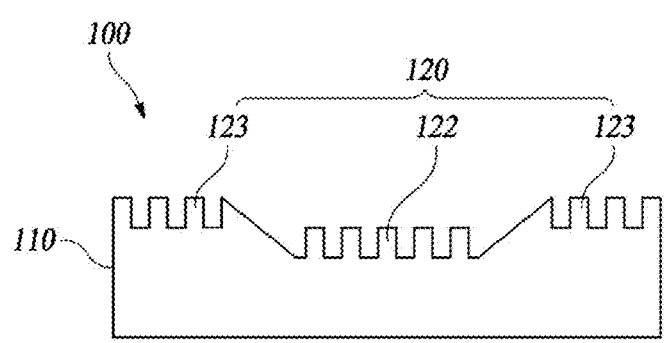
FIG. 2A is a sectional view schematically showing the case in which a shock compensation pattern unit is formed at one surface of a glass substrate in accordance with an embodiment of the present invention.
Figure 2B:
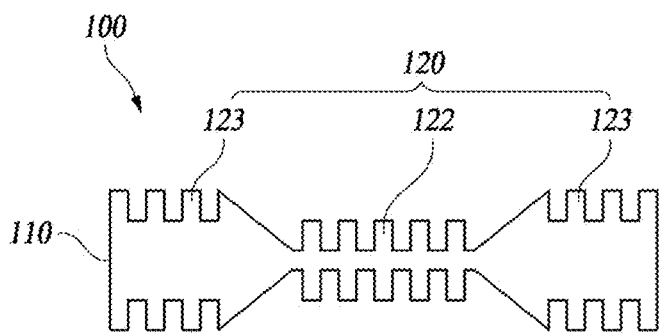
FIG. 2B is a sectional view schematically showing the case in which a shock compensation pattern unit is formed at opposite surfaces of a glass substrate in accordance with an embodiment of the present invention.
Figure 3A:
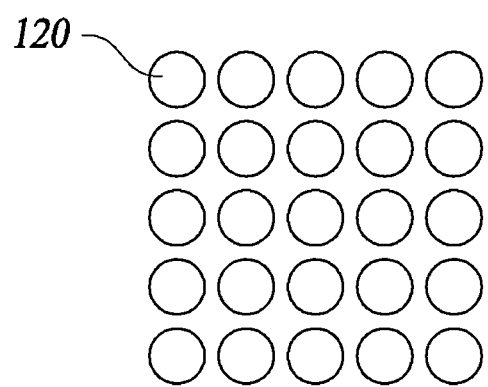
FIG. 3A is a sectional view schematically showing lattice-array patterns of a shock compensation pattern unit according to an embodiment of the present invention.
Figure 3B:
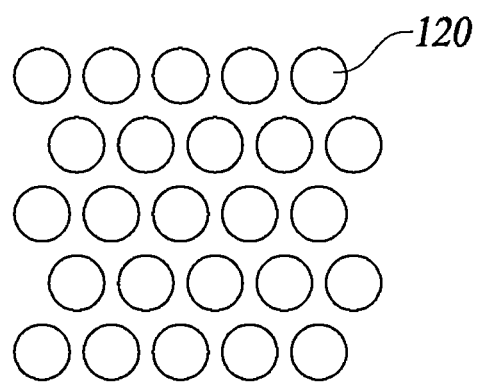
FIG. 3B is a sectional view schematically showing cross-array patterns of a shock compensation pattern unit according to an embodiment of the present invention.
Figure 4:
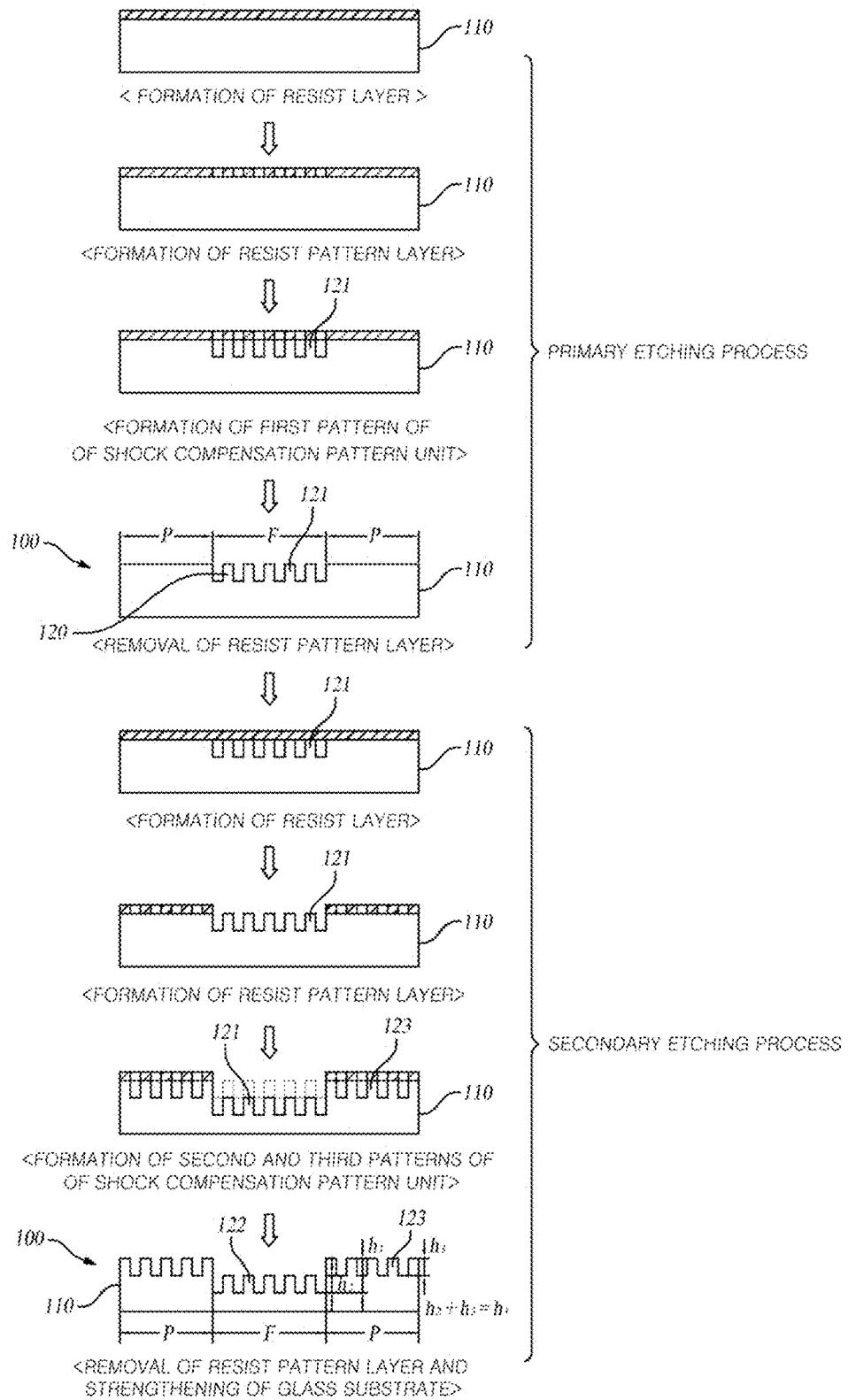
FIGS. 4 to 6 are schematic views showing flexible cover window manufacturing methods according to various embodiments of the present invention.
Figure 5:
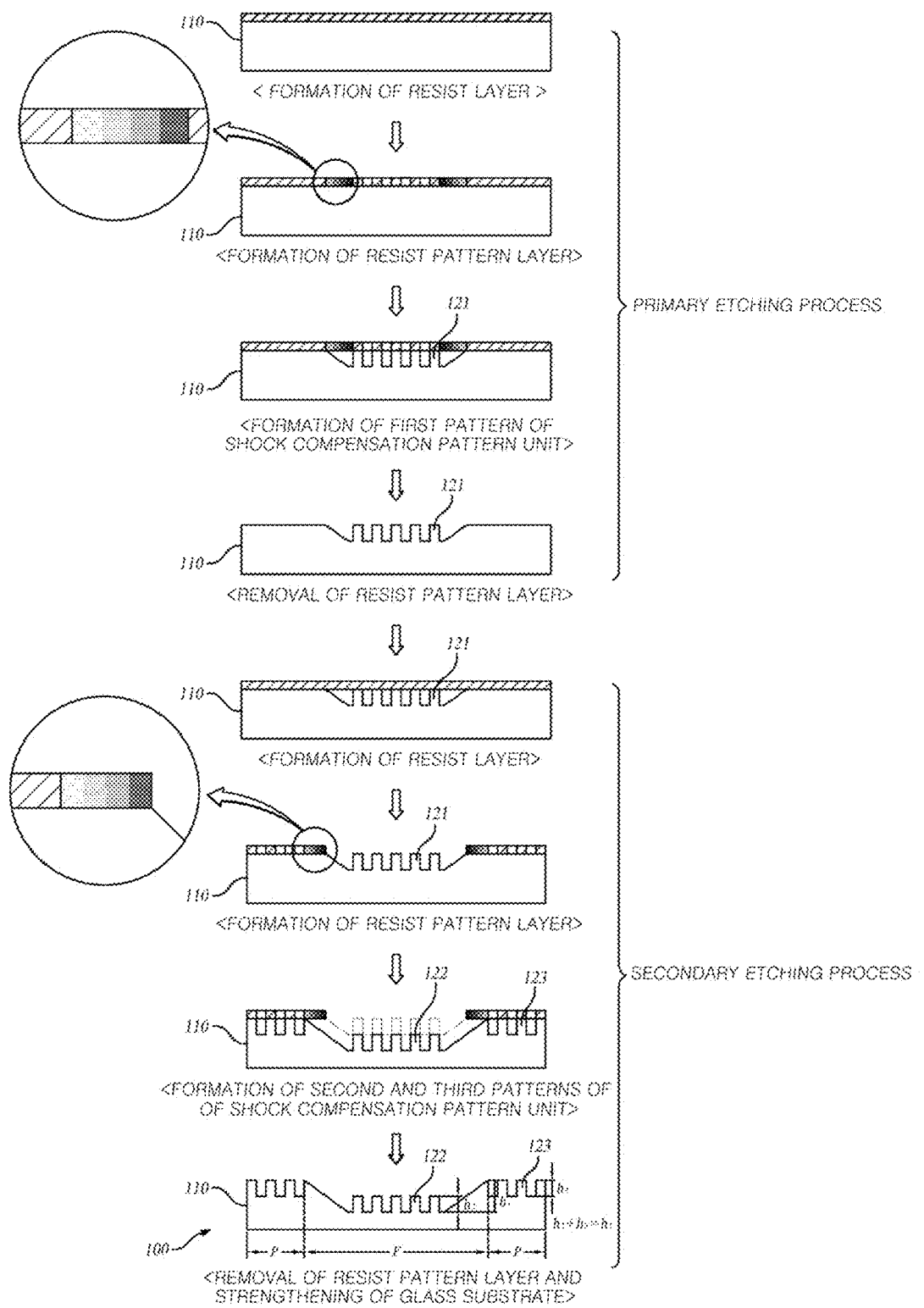
Figure 6:
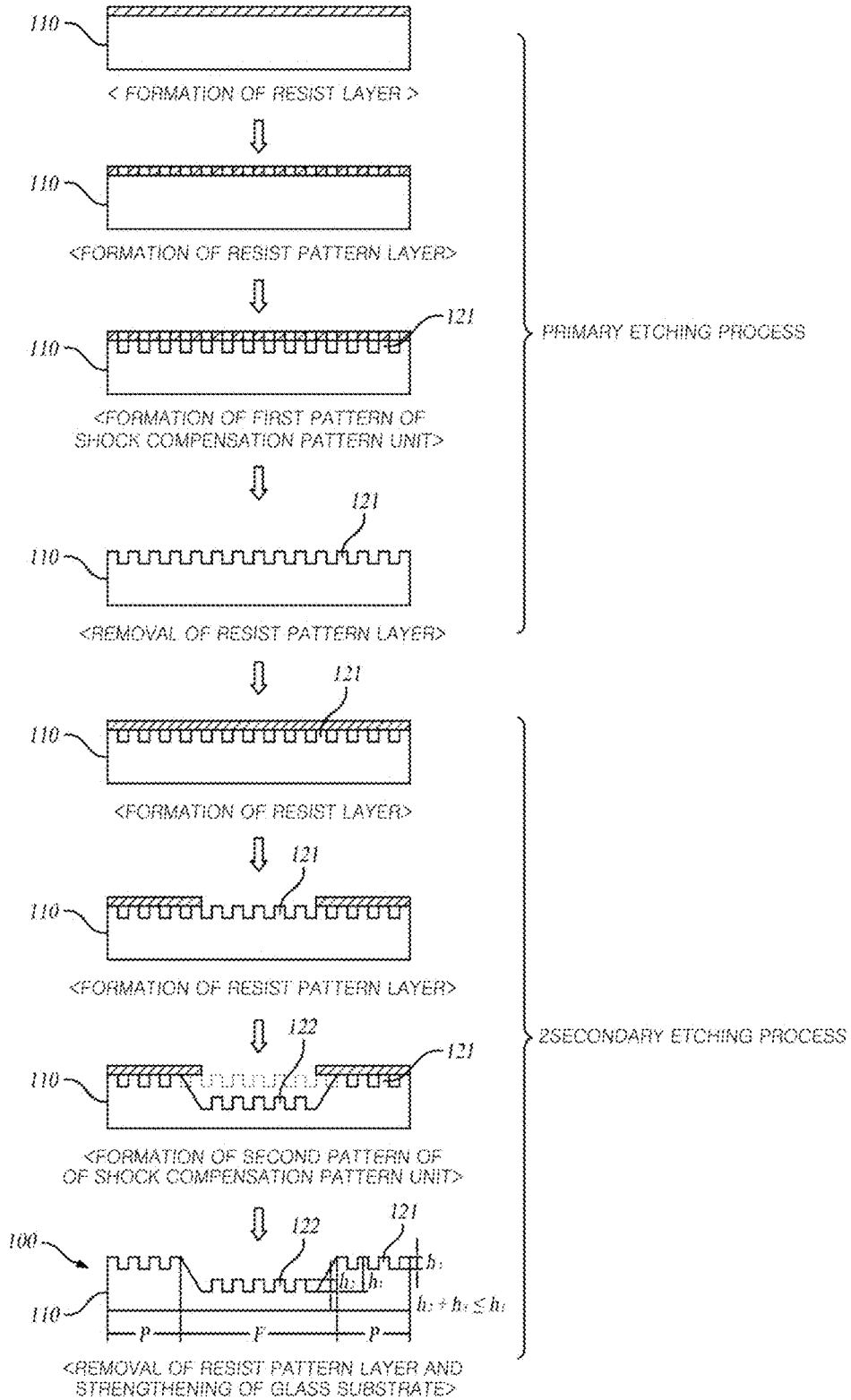
Figure 7A:
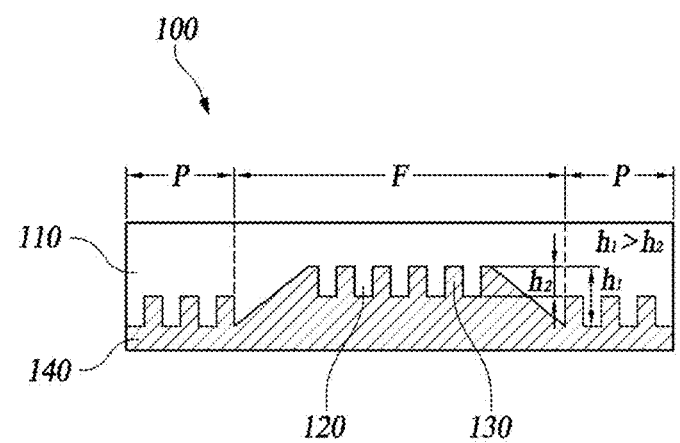
FIG. 7A is a sectional view schematically showing a flexible cover window according to an embodiment of the present invention.
Figure 7B:
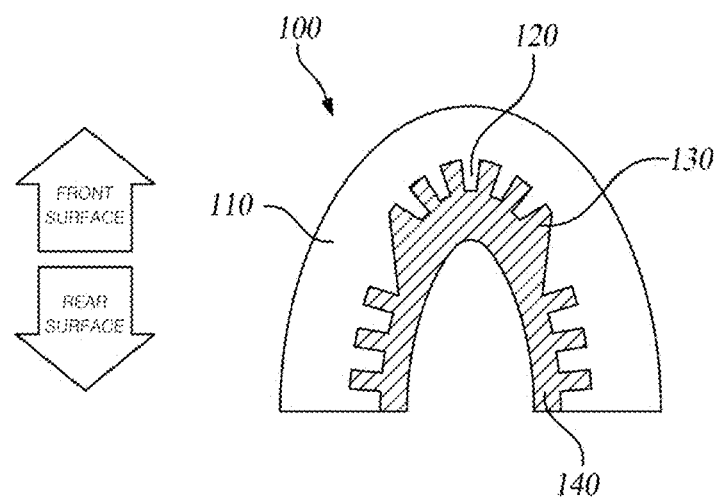
FIG. 7B is a sectional view schematically showing a flexible cover window according to an embodiment of the present invention.
Figure 8:
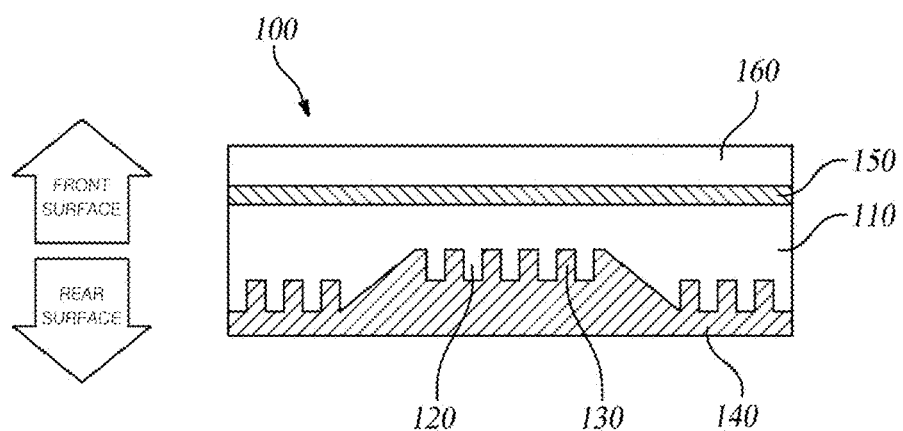
FIG. 8 is a sectional view schematically showing a flexible cover window according to an embodiment of the present invention.
Figure 9A:
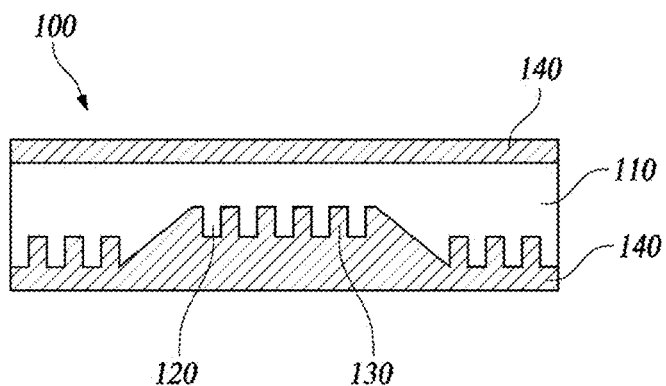
FIG. 9A is a sectional view schematically showing a flexible cover window according to an embodiment of the present invention.
Figure 9B:
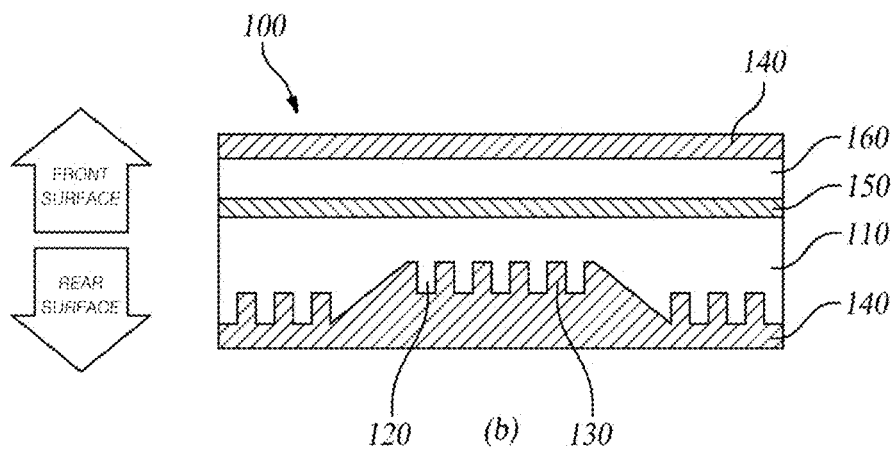
FIG. 9B is a sectional view schematically showing a flexible cover window according to an embodiment of the present invention.
Figure 10A:
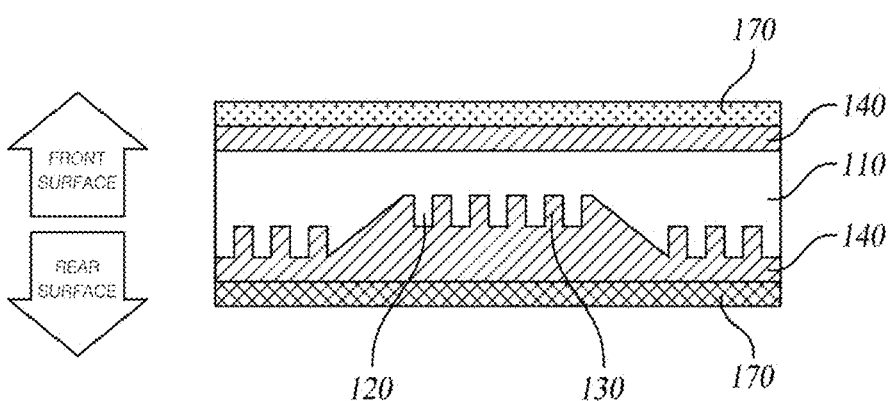
FIG. 10A is a sectional view schematically showing a flexible cover window according to an embodiment of the present invention.
Figure 10B:
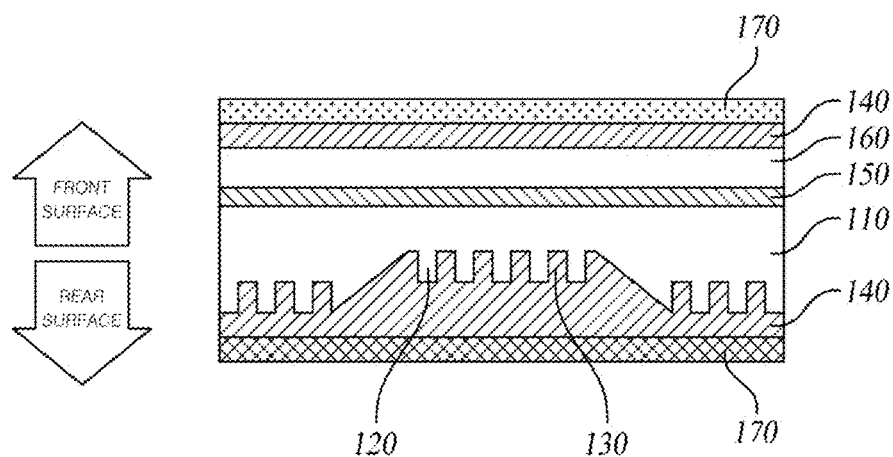
FIG. 10B is a sectional view schematically showing a flexible cover window according to an embodiment of the present invention.

FIG. 1A is a sectional view schematically showing the case in which a shock compensation pattern unit is formed at one surface of a glass substrate in accordance with an embodiment of the present invention, FIG. 1B is a sectional view schematically showing the case in which a shock compensation pattern unit is formed at opposite surfaces of a glass substrate in accordance with an embodiment of the present invention, FIG. 2A is a sectional view schematically showing the case in which a shock compensation pattern unit is formed at one surface of a glass substrate in accordance with an embodiment of the present invention, FIG. 2B is a sectional view schematically showing the case in which a shock compensation pattern unit is formed at opposite surfaces of a glass substrate in accordance with an embodiment of the present invention, FIG. 3A is a sectional view schematically showing lattice-array patterns of a shock compensation pattern unit according to an embodiment of the present invention, FIG. 3B is a sectional view schematically showing cross-array patterns of a shock compensation pattern unit according to an embodiment of the present invention, FIGS. 4 to 6 are schematic views showing flexible cover window manufacturing methods according to various embodiments of the present invention, FIG. 7A is a sectional view schematically showing a flexible cover window according to an embodiment of the present invention, FIG. 7B is a sectional view schematically showing a flexible cover window according to an embodiment of the present invention, FIG. 8 is a sectional view schematically showing a flexible cover window according to an embodiment of the present invention, FIG. 9A is a sectional view schematically showing a flexible cover window according to an embodiment of the present invention, FIG. 9B is a sectional view schematically showing a flexible cover window according to an embodiment of the present invention, FIG. 10A is a sectional view schematically showing a flexible cover window according to an embodiment of the present invention, and FIG. 10B is a sectional view schematically showing a flexible cover window according to an embodiment of the present invention.

As shown, the flexible cover window 100 according to the present invention is a glass-based flexible cover window including planar portions P formed so as to correspond to planar regions of a flexible display and a folding portion F formed so as to be connected to the planar portions P, the folding portion F being formed so as to correspond to a folding region of the flexible display, the folding portion F having a smaller thickness than each of the planar portions P, wherein the flexible cover window includes a glass substrate 110 and a shock compensation pattern unit 120 formed on the glass substrate 110, the shock compensation pattern unit 120 is formed at each of the planar portions P and the folding portion F, and the shock compensation pattern unit 120 has cylindrical patterns.

In the present invention, the folding region of the display is the region of the display at which the display is folded in two or the region of the display at which the display is bent. Also, in the present invention, the folding region of the cover window corresponding to the folding region of the display is referred to as a "folding portion" F of the cover window 100, and the planar regions of the cover window excluding the folding portion are referred to as "planar portions" P of the cover window 100.

In particular, the flexible cover window according to the present invention is a glass-based flexible cover window. It is preferable that the folding portion F be formed so as to have a smaller thickness than each of the planar portions P, i.e. the folding portion F be formed so as to be slimmer than each of the planar portions P. In general, the thickness of each of the planar portions P of the cover window 100 is 50 to 300 μm, and the thickness of the folding portion F of the cover window 100 is 10 to 100 μm. A very thin sheet of glass is processed to form the folding portion F.

Here, the folding portion F may be formed so as to have a uniform thickness, or may be formed so as to have a thickness gradually increasing from the middle to the edge of the folding region. That is, the folding portion F may be formed in a straight line or a curved line.

In the case in which the folding portion F is formed in a straight line, folding properties are improved more than in the case in which the folding portion F is formed in a curved line. In the case in which the folding portion F is formed in a curved line, a minimum thickness range is relatively small. When folding is repeatedly performed, therefore, a large thickness portion is broken at the time of folding, whereby folding properties are deteriorated. On the other hand, in the case in which the folding portion F is generally formed so as to have a uniform thickness, i.e. in the case in which the folding portion F is formed in a straight line so as to have an equal thickness, a minimum thickness region is formed wide. As a result, flexibility, restoring force, and elastic force are increased, whereby folding properties are improved.

In addition, it is not easy to center the curved folding portion F at the time of mechanical assembly. However, the folding portion F according to the present invention is formed so as to have a uniform thickness, and therefore assembly tolerance may be reduced at the time of mechanical assembly, i.e. at the time of joining the folding portion F to the entire surface of a display panel. Consequently, it is possible to minimize quality difference between products, whereby it is possible to reduce a defect rate.

Although the straight folding portion F is superior to the curved folding portion F, as described above, the straight folding portion F or the curved folding portion F may be selectively manufactured depending on the specifications of a product.

Here, the width of the folding portion F is designed in consideration of the radius of curvature of the cover window 100 when the cover window 100 is folded. In general, the width of the folding portion F is set to the radius of curvature×π. The thickness of the cover window 100 at the folding portion F is 10 to 100 μm, which is related to the folding portion F.

In the case in which the depth of the folding portion F is too large, i.e. in the case in which the folding region of the cover window 100 is too thin, foldability is high, but wrinkles are formed or strength is lowered at the time of strengthening. In the case in which the folding portion F is formed excessively thick, on the other hand, flexibility, restoring force, and elastic force at the folding region are decreased, whereby folding properties are deteriorated. Consequently, it is preferable that the thickness of the cover window 100 at the folding portion F be about 10 to 100 µm.

In the present invention, the cover window 100 is a glass-based cover window having a thickness of 50 to 300 µm, which is used after chemical strengthening. Within this thickness, the width and depth of the folding portion F are appropriately designed, as described above. In the case in which the cover window 100 has a thickness less than the above thickness range, the thickness of the folding region of the cover window 100 is too small after the folding portion F is formed, whereby the above problems occur. In the case in which the cover window 100 has a thickness greater than the above thickness range, on the other hand, flexibility, restoring force, and elastic force of the glass-based cover window are reduced, whereby weight reduction of a display product is hindered.

In an embodiment of the present invention, the folding portion F is slimmed inwards from the folding region of the cover window 100 so as to generally have a quadrangular trench shape. Inclined portions having gradually increasing thicknesses may be formed at opposite ends of the folding portion F such that the folding portion F is smoothly connected to the planar regions of the cover window 100.

In particular, inclined portions having low gradients are formed at opposite ends of the folding portion F (borders with the planar portions P) so as to similarly adjust the size of an angle of reflection by a reflective surface at the entire region of the folding portion F in order to minimize light interference and visibility to the naked eye at the reflective surface.

In the present invention, folding properties and strength properties of the cover window are maintained. Consequently, the cover window is formed on the entire surface of the display panel to protect the display panel. Alternatively, the cover window may be disposed on a clear polyimide (CPI) cover in order to protect the CPI cover.

As described above, the present invention provides a glass-based flexible cover window 100 having a folding portion F that is a thin sheet applicable to a flexible display while having improved strength and folding properties, wherein a shock compensation pattern unit 120 is provided at a straight or curved folding portion F.

To this end, as shown in FIGS. 1 to 3, the flexible cover window according to the present invention includes a shock compensation pattern unit 120 formed at the folding portion F and the planar portions P, wherein the shock compensation pattern unit 120 has cylindrical patterns.

The shock compensation pattern unit 120 may be formed at one surface or opposite surfaces of the glass substrate 110, wherein the glass substrate 110 may be etched through a dry or wet etching process to successively form patterns of the same size or different sizes that are arranged regularly or irregularly.

The shock compensation pattern unit 120 has cylindrical patterns. In addition, as shown in FIG. 3, the shock compensation pattern unit 120 may have lattice-array patterns (FIG. 3A) or cross-array patterns (FIG. 3B) in order to improve folding properties and to uniformly disperse shock.

That is, in order to improve folding properties of the cover window 100, predetermined patterns are also formed at the planar portions P while predetermined patterns are formed at the folding portion F in the process of etching for slimming to form the folding portion F.

Generally, in the case in which the flexible cover window 100 is manufactured using the glass material, the thickness of the glass substrate 110 must be small. In order to secure strength properties, however, the glass substrate 110 must have a specific thickness or more.

For example, in the case in which the radius of curvature at the time of folding must satisfy a minimum of 0.5 mm, the cover window 100 may have a thickness of 200 µm or less, preferably 20 to 100 µm. In this case, when an object having a small sectional area collides with the upper surface (the front surface) of the glass substrate 110, i.e. when pen drop occurs, the entire glass substrate 110 may be deformed or damaged around the pen-drop contact portion thereof.

In particular, for a cover window 100 having a slimmed folding region, the thickness of the folding region is particularly small, whereby pen-drop resistance properties thereof are very weak. In addition, a stress difference occurs due to a thickness difference between the folding region and each of the planar regions, whereby a waviness problem of the glass substrate 110 also occurs. As a result, shock resistance of the cover window is very low.

In the present invention, the shock compensation pattern unit 120 is formed at one surface or opposite surfaces of the glass substrate 110 in order to improve shock resistance through improvement in the pen-drop resistance properties at the folding portion F and at the same time to improve folding properties and strength properties. In order to improve overall pen-drop resistance properties of the glass substrate 110 as well as the folding portion F that has low pen-drop resistance properties, the shock compensation pattern unit 120 is also formed at the planar portions P.

In particular, the shock compensation pattern unit 120 has patterns having a circular sectional area, i.e. cylindrical patterns, rather than conventional stripe patterns. The shock compensation pattern unit 120 is formed simultaneously with the folding portion F.

Generally, in the case in which shock, such as pen drop, is applied to the cover window 100, shock that is transmitted vertically is stronger than shock that is transmitted horizontally. The shock compensation pattern unit 120 according to the present invention has a plurality of cylindrical patterns. Consequently, it is possible to efficiently disperse or support vertical shock, whereby it is possible to remarkably improve pen-drop resistance properties.

That is, shock, such as pen drop, is transmitted into the glass substrate 110 and collides with or is absorbed by the cylindrical patterns of the shock compensation pattern unit 120, whereby the shock is efficiently dispersed or absorbed. In addition, gaps between the cylindrical patterns are filled with a transparent resin material 130, a description of which will follow, whereby the effect of absorbing and supporting shock is remarkably improved.

Also, in the present invention, the shock compensation pattern unit 120 is formed at the folding portion F. Even in the case in which slimming of the folding portion F is minimized, it is possible to maintain folding properties. Consequently, it is possible to reduce a stress difference due to a thickness difference from each of the planar portions P, whereby it is possible to improve shock resistance and to minimize screen distortion or resolution lowering, and therefore it is possible to provide a high-quality flexible display.

In addition, pattern density of the shock compensation pattern unit 120 formed at the folding portion F and pattern density of the shock compensation pattern unit 120 formed at each of the planar portions P may be equal to each other. Particularly, in order to improve pen-drop resistance properties at the folding portion F, the thickness of which is small, the shock compensation pattern unit 120 may be formed at the folding portion F in such a manner that pattern density of the shock compensation pattern unit 120 formed at the folding portion F is higher than pattern density of the shock compensation pattern unit 120 formed at each of the planar portions P.

Specifically, in the case in which pattern density of the shock compensation pattern unit 120 formed at each of the planar portions P is about 10 to 50% based on the entire glass substrate 110, pattern density of the shock compensation pattern unit 120 formed at the folding portion F may be equal or similar to pattern density of the shock compensation pattern unit 120 formed at each of the planar portions P or may be about 20 to 70%, which is higher than pattern density of the shock compensation pattern unit 120 formed at each of the planar portions P.

In the case in which pattern density of the shock compensation pattern unit 120 formed at the folding portion F is greater than the above range, strength may be reduced. Consequently, it is preferable that pattern density be formed within the above range.

This is necessary to further improve a shock dispersion effect while further improving folding properties at the folding portion F, the thickness of which is relatively small.

In general, the rear surface of the glass substrate 110 (the surface of the glass substrate opposite the surface to which shock is applied) has lower resistance to pen drop. In an embodiment of the present invention, as shown in FIGS. 1A and 2A, the shock compensation pattern unit 120 according to the present invention may be formed at the rear surface of the glass substrate 110 (the upper side in the figures).

Consequently, shock applied to the front surface (the touch surface) of the glass substrate 110 is transmitted into the glass substrate 110 and is dispersed or absorbed by the shock compensation pattern unit 120 having the cylindrical patterns.

In addition, as shown in FIGS. 1B and 2B, the shock compensation pattern unit 120 may be formed at opposite surfaces of the glass substrate 110, i.e. the front surface and the rear surface of the glass substrate 110. Consequently, shock is primarily absorbed by the shock compensation pattern unit 120 formed at the front surface of the glass substrate 110, i.e. the surface of the glass substrate 110 including the contact portion to which shock is applied, and shock transmitted into the glass substrate 110 is absorbed by the shock compensation pattern unit 120 formed at the rear surface of the glass substrate 110.

Here, the shock compensation pattern unit 120 formed at the front surface of the glass substrate 110 and the shock compensation pattern unit 120 formed at the rear surface of the glass substrate 110 may be identical to or different from each other in terms of size of each pattern (the diameter of each cylinder), distance between patterns, and height of each pattern (the height of each cylinder) depending on the specifications or use of a product.

Also, in the present invention, it is preferable that the height of the shock compensation pattern unit 120 be half or less of the thickness of the glass substrate 110 and be formed within a range of 10 to 30% based on the thickness of the glass substrate 110.

In the case in which the height of the shock compensation pattern unit 120 is less than the above range, the shock dispersion effect is insignificant. In the case in which the height of the shock compensation pattern unit 120 is greater than the above range, on the other hand, overall strength properties may be deteriorated due to a decrease in effective thickness.

In an embodiment of the present invention, it is preferable that the size of each pattern of the shock compensation pattern unit 120 be 0.08 to 0.15 mm and that the distance between the patterns be 0.05 to 0.12 mm.

In the case in which the size of each pattern is greater than the above range, folding properties may be deteriorated. In the case in which the size of each pattern is less than the above range, on the other hand, pen-drop resistance properties may be deteriorated. In the case in which the distance between the patterns is greater than the above range, pen-drop resistance properties may be deteriorated. In the case in which the distance between the patterns is less than the above range, on the other hand, folding properties may be deteriorated.

Also, it is preferable that the height of the shock compensation pattern unit 120 be less than the depth of the folding portion F. That is, the process of sliming the folding portion F and the process of forming the shock compensation pattern unit 120 are simultaneously performed. As a result, the height of the shock compensation pattern unit 120 is formed so as to be less than the depth of the folding portion F. This will be described below in more detail.

The shock compensation pattern unit 120 may be formed through a dry or wet etching process. In an embodiment of the present invention, the shock compensation pattern unit 120 is formed through an etching process using a photo mask.

A shock compensation pattern unit 120 according to an embodiment of the present invention is formed through a wet etching process using a photo mask. As shown in FIGS. 4 to 6, a shock compensation pattern unit 120 is formed by a first step of forming a resist layer on a glass substrate 110, a second step of patterning the resist layer to form a resist pattern layer for formation of a first pattern 121 on the entire surface or a folding region of the glass substrate 110, a third step of performing a primary etching process using the resist pattern layer of the second step as a mask to form a first pattern 121 on the entire surface or the folding region of the glass substrate 110 and removing the resist pattern layer, a fourth step of forming a resist layer on the glass substrate 110 having the first pattern 121 formed thereon, a fifth step of patterning the resist layer to form a resist pattern layer for formation of a second pattern 122 on the folding region and to form a resist pattern layer for formation of a third pattern 123 on planar regions of the glass substrate 110, and a sixth step of performing a secondary etching process using the resist pattern layer of the fifth step as a mask to further etch the folding region, thereby forming a second pattern 122 at the folding region, or to etch the entire surface of the glass substrate 110, thereby forming a second pattern 122 at the folding region and forming a third pattern 123 at the planar regions, and removing the resist pattern layer.

Subsequently, the glass substrate 110 including the shock compensation pattern unit 120 is strengthened in a seventh step, whereby a cover window 100 including the shock compensation pattern unit 120 is completed.

That is, the first pattern 121 is formed at the entire surface of the glass substrate 110 and the second pattern 122 is formed only at the folding region, whereby the shock compensation pattern unit is formed at the folding portion F and the planar portions P (FIG. 6), or the first pattern 121 is formed first at the folding region, the entire surface of the glass substrate 110 is etched to form the second pattern 122 at the folding region and to form the third pattern 123 at the planar regions, whereby the shock compensation pattern unit is formed at the folding portion F and the planar portions P (FIGS. 4 and 5).

The patterns are formed at the entire surface of the glass substrate, as described above, whereby it is possible to prevent the surface of the glass substrate from being scratched. In particular, scratch percentage of a general thin glass substrate is about 24%. In the case in which the pattern forming process according to the present invention is performed, however, scratch percentage of the glass substrate is reduced to about 0.4%, whereby it is possible to provide a high-quality cover window.

In order to form the shock compensation pattern unit 120 at the entirety of the cover window having the folding portion F, the thickness of which is less than the thickness of each of the planar portions P, according to the present invention, first, a photoresist is coated on the glass substrate 110 or a dry film resist (DFR) is laminated on the glass substrate 110 to form a resist layer (first step), and a resist pattern layer for formation of a first pattern 121 is formed at the entire surface or the folding region of the glass substrate 110 through a patterning process for light exposure and development using a photo mask having a pattern corresponding to the resist layer (second step).

Here, the resist pattern layer may be formed as a compensation pattern layer for formation of the shock compensation pattern unit 120, or may be realized as a compensation pattern layer for formation of the shock compensation pattern unit 120 and a gradation pattern layer for formation of inclined portions between the planar portions P and the folding portion F at opposite sides of the pattern.

The folding portion F according to the present invention may be formed in a vertical trench shape as the shape of the side surface thereof, as shown in FIG. 1, or inclined portions may be formed between the folding portion F and the planar portions P in order to improve border visibility, as shown in FIG. 2.

In the case in which the folding portion F is formed in a vertical trench shape, the resist pattern layer may be formed as a compensation pattern layer for formation of the shock compensation pattern unit 120. In the case in which the inclined portions are formed between the planar portions P and the folding portion F, a compensation pattern layer for formation of the shock compensation pattern unit 120 may be formed, and a gradation pattern layer may be further formed at opposite sides of the compensation pattern layer.

The compensation pattern layer is formed so as to have circular patterns in order to form cylindrical patterns. In accordance with an embodiment of the present invention, the gradation pattern layer is realized as patterns having an open rate gradually decreasing from the folding portion F to the planar portions P, and is formed so as to correspond to regions at which the inclined portions are formed.

Depending on process conditions, fine spaces may be provided between the DFR and the glass substrate 110 at the borders of the folding portion F to form inclined portions instead of the gradation pattern layer.

Subsequently, a first pattern 121 is formed at the entire surface or the folding region of the glass substrate through a primary etching process using the resist pattern layer as a mask, and the resist pattern layer is removed (third step).

Subsequently, a resist layer is formed on the glass substrate 110 having the first pattern 121 formed thereon (fourth step), and the resist layer is patterned to form a resist pattern layer for formation of a second pattern 122 on the folding region or to form a resist pattern layer for formation of a second pattern 122 on the folding region and to form a resist pattern layer for formation of a third pattern 123 on planar regions (fifth step).

At this time, the resist pattern layer is formed such that the folding region is completely open, and is formed such that the planar regions are completely masked or have a pattern corresponding to a predetermined shape of the third pattern 123. Here, each of borders between the planar portions P and the folding portion F may be realized as a gradation pattern layer in order to form an inclined portion.

The gradation pattern layer may be realized in one or both of the primary etching process and the secondary etching process depending on the specifications of a product. In an embodiment of the present invention, a resist pattern layer realized as a gradation pattern layer is used in both of the primary etching process and the secondary etching process.

The embodiment of FIG. 4 shows that a folding portion F having a vertical trench shape is formed using a compensation pattern layer, the embodiment of FIG. 5 shows that a folding portion F having inclined portions is formed using a gradation pattern layer, and the embodiment of FIG. shows that fine spaces are provided between the resist pattern layer and the glass substrate 110 at the borders of the folding portion F to form a folding portion F including inclined portions instead of a gradation pattern layer.

A secondary etching process using the resist pattern layer as a mask may be performed to further etch the folding region, thereby forming a second pattern 122 at the folding region, or to etch the entire surface of the glass substrate 110, thereby forming a second pattern 122 at the folding region and forming a third pattern 123 at the planar regions, and the resist pattern layer is removed (sixth step).

That is, the first pattern 121 is formed at the entire surface of the glass substrate 110 and the second pattern 122 is formed only at the folding region, whereby the shock compensation pattern unit is formed at the folding portion F and the planar portions P, or the first pattern 121 is formed first at the folding region, the entire surface of the glass substrate 110 is etched to form the second pattern 122 at the folding region and to form the third pattern 123 at the planar regions, whereby the shock compensation pattern unit is formed at the folding portion F and the planar portions P.

As a result, the depth h1 of the folding portion F is formed by the sum of the primary etching depth and the secondary etching depth, the height h2 of the second pattern 122 formed at the folding portion F is formed by the primary etching depth, and the height h3 of the first pattern formed at each of the planar portions P is formed by the primary etching depth. In another embodiment, the height h3 of the third pattern 123 formed at each of the planar portions P is formed by the secondary etching depth.

As the result of the primary etching process and the secondary etching process, therefore, the height h2 of the pattern (the second pattern 122) of the shock compensation pattern unit 120 formed at the folding portion F is less than the height h1 of the folding portion F. That is, the second pattern 122 is formed at the slimmed folding portion F.

In the shock compensation pattern unit 120 having the first pattern 121 (the planar portions) and the second pattern 122 (the folding portion) or the second pattern 122 (the folding portion) and the third pattern 123 (the planar portions) according to the other embodiment, the number of processes or process conditions thereof are adjusted to adjust the shape of the pattern or the size of the patterns and the distance between the patterns according to the specifications or use of a product, whereby it is possible to provide the glass substrate 110 having the shock compensation pattern unit 120 formed at the slimmed folding portion F and the planar portions P.

Here, the etching depth according to the primary etching process is 0.0005 to 0.28 mm, and the etching depth according to the secondary etching process is 0.01 to 0.2 mm.

The etching depth according to the primary etching process and the etching depth according to the secondary etching process may be adjusted to control the depth h1 of the folding portion F, the height h2 of the second pattern 122 at the folding portion F, and the height h3 of the third pattern 123 at each of the planar portions P, whereby it is possible to improve pen-drop resistance properties and folding properties.

Particularly, in an embodiment including a process of forming a shock compensation pattern unit by etching the entire surface of the glass substrate first to form a first pattern 121 and forming a second pattern 122 at the folding region, a value (h2+h3) obtained by summing the height h2 of the second pattern 122 at the folding portion F and the height h3 of the first pattern 121 at each of the planar portions P is equal to or less than the depth h1 of the folding portion F.

Also, in an embodiment including a process of forming a shock compensation pattern unit by forming a first pattern 121 at the folding portion F and etching the entire surface of the glass substrate to form a second pattern 122 at the folding portion F and to form a third pattern 123 at each of the planar portions P, a value (h2+h3) obtained by summing the height h2 of the second pattern 122 at the folding portion F and the height h3 of the third pattern 123 at each of the planar portions P is equal to the depth h1 of the folding portion F.

In various embodiments of the present invention, etching process conditions may be adjusted depending on required specifications of a product, whereby it is possible to adjust the depth of the folding portion and the height of the shock compensation pattern unit.

As described above, the cover window including the shock compensation pattern unit having the cylindrical patterns formed on the glass substrate is formed, whereby scratching is reduced, vertical shock, such as pen drop, is supported and dispersed, and therefore it is possible to improve resistance to pen drop, folding properties, and overall strength properties.

Subsequently, the glass substrate 110 having the shock compensation pattern unit 120 having the cylindrical patterns formed thereon undergoes a general chemical strengthening process, whereby the strength of the glass substrate is reinforced (seventh step).

Meanwhile, the patterns of the shock compensation pattern unit 120 are filled with a transparent resin material 130 such that the transparent resin material is joined to the overall surface of the display panel without an empty space, as shown in FIG. 7.

Gaps between the cylindrical patterns of the shock compensation pattern unit 120 are filled with the transparent resin material 130, whereby a cover window 100 having a generally uniform thickness is provided and shock is absorbed. In addition, there is no empty space (air layer) when the transparent resin material is joined to the entire surface of the display panel, whereby visibility and joinability are improved.

A transparent resin having a refractive index almost equal to the refractive index (1.5) of glass, such as an optically clear resin (OCR), may be used as the transparent resin material 130. For example, acrylic, epoxy, silicone, urethane, a urethane compound, a urethane acrylic compound, a sol-gel hybrid solution, or a siloxane-based resin may be used. The transparent resin material 130 may be used in various combinations depending on the properties thereof in order to improve strength and elasticity.

In addition, a transparent resin layer 140 may be formed on the transparent resin material 130 above the shock compensation pattern unit 120. The transparent resin material 130 and the transparent resin layer 140 may be successively formed through the same process using the same material. Alternatively, the transparent resin material 130 and the transparent resin layer 140 may be successively formed through sequential processes using the same material or different materials.

That is, the transparent resin material 130 and the transparent resin layer 140 may be simultaneously formed through the same process, or may be separately formed through different processes as needed. In addition, each of the transparent resin material 130 and the transparent resin layer 140 may be formed in a single-layer structure or a multilayer structure so as to have a specific functionality.

The transparent resin layer 140 may be formed at the front surface and the rear surface of the glass substrate 110, or may be formed at the front surface, the rear surface, and the entire side surface of the glass substrate 110. The transparent resin layer 140 formed at the rear surface of the glass substrate 110 and the transparent resin layer 140 formed at the front surface of the glass substrate 110 may be made of the same material. Alternatively, the transparent resin layer 140 formed at the rear surface of the glass substrate 110 may be made of a softer material than the transparent resin layer 140 formed at the front surface of the glass substrate 110.

The reason for this is that it is necessary to form a transparent resin layer 140 made of a hard material at the user touch portion in order to maintain durability.

In addition, a relatively hard material may be formed at the portion that is folded while a relatively soft material may be formed at the portion that is stretched according to an in-folding mode or an out-folding mode, whereby it is possible to minimize the occurrence of cracks at the portion that is stretched.

FIG. 7 shows that the shock compensation pattern unit 120 is filled with the transparent resin material 130 and the transparent resin layer 140 is formed thereon in accordance with an embodiment of the present invention.

Referring to FIG. 7A, the shock compensation pattern unit 120 is formed at the rear surface of the glass substrate 110, and the shock compensation pattern unit 120 is filled with the transparent resin material 130, and the transparent resin layer 140 is formed at the upper side of the transparent resin material 130 on the glass substrate 110. FIG. 7B is a schematic view showing that the cover window 100 of FIG. 7A is out-folded.

Also, in another embodiment of the present invention, as shown in FIG. 8, a shock-absorbing resin layer 150 is formed at the front surface of the glass substrate 110 having the shock compensation pattern unit 120 formed thereon and a cover glass substrate 160 is formed on the shock-absorbing resin layer 150.

That is, the shock-absorbing resin layer 150 is formed between the glass substrate 110 and the cover glass substrate 160, and the shock compensation pattern unit 120 is formed at the rear surface of the glass substrate 110.

In the case in which a shock is applied to the front surface, therefore, shock is primarily absorbed by the shock-absorbing resin layer 150, and the shock is secondarily absorbed by the shock compensation pattern unit 120.

In this case, each of the cover glass substrate 160 and the glass substrate 110 may be formed so as to have a smaller thickness. In addition, resistance to pen drop is improved, folding properties are improved, and overall strength is increased.

Referring to FIG. 9A, the shock compensation pattern unit 120 is formed at the rear surface of the glass substrate 110, the shock compensation pattern unit 120 is filled with the transparent resin material 130, and the transparent resin layer 140 is formed at the upper side of the transparent resin material 130 on the glass substrate 110 and at the front surface of the glass substrate 110.

Referring to FIG. 9B, the shock compensation pattern unit 120 is formed at the rear surface of the glass substrate 110, the shock compensation pattern unit 120 is filled with the transparent resin material 130, the shock-absorbing resin layer 150 is formed at the front surface of the glass substrate, the cover glass substrate 160 is formed thereon, and the transparent resin layer 140 is formed at the upper side of the transparent resin material 130 and at the front surface of the cover glass substrate 160.

As described above, the transparent resin layer 140 formed at the front surface is made of a harder material than the transparent resin layer 140 formed at the rear surface.

As shown in FIGS. 7 to 9, the cover window according to the present invention is realized using a combination of glass and a resin material, whereby flexibility, restoring force, elastic force, and strength properties are reinforced by the resin material while texture of the glass is maximally maintained.

Particularly, in the present invention, the shock compensation pattern unit 120 is formed at the folding portion F and the planar portions P on the glass substrate 110, and the transparent resin material 130 and the transparent resin layer 140 are further formed, whereby it is possible to further disperse or absorb shock, such as pen drop, and therefore it is possible to further improve shock resistance.

In addition, the shock compensation pattern unit 120 is uniformly filled with the transparent resin material 130, whereby it is possible to secure flatness at the portion that abuts the display panel while minimizing the occurrence of cracks at the folding portion F and preventing the shock compensation pattern unit 120 from being visible outside.

In addition, the elasticity of the cover window 100 at the surface thereof that abuts the display panel is reinforced, whereby it is possible to improve shock resistance and to prevent the glass from being scattered when the glass is broken.

Meanwhile, as shown in FIG. 10, a functional coating layer 170 may be further formed at one surface or opposite surfaces of the cover window 100 in the embodiment of FIG. 9. The functional coating layer 170 is made of a transparent material, like the transparent resin material 130. Resins having various properties may be combined to provide functionality.

In the case in which the shock compensation pattern unit 120 is filled with the transparent resin material 130 or in the case in which the transparent resin layer 140 is formed at the entire surface of the glass substrate 110, the functional coating layer 170 may be formed thereon. The functional coating layer 170 may be formed using a known resin coating method, such as spraying, dipping, or spin coating.

The functional coating layer 170 may be formed so as to have a single-layer structure or a multilayer structure. The functional coating layer 170 formed at the front surface of the cover window 100 may be realized as a strength reinforcement layer, and the functional coating layer 170 formed at the rear surface of the cover window 100 may be realized as an elasticity reinforcement layer.

That is, since touch is performed at the front surface of the cover window 100, a functional coating layer 170 having further reinforced strength is realized, and a functional coating layer 170 having reinforce elasticity may be realized at the rear surface of the cover window 100 so as to perform shock-absorbing action between the display panel and the cover window 100.

The strength reinforcement layer (hard coating) at the front surface of the cover window 100 is made of a material including a high content of a resin having relatively high hardness when hardened, such as acrylic or epoxy, and the elasticity reinforcement layer (soft coating) at the rear surface of the cover window 100 is made of a material including a high content of a resin having relatively high elasticity when hardened, such as silicone or a urethane composite resin. In addition, the content of an organic material and an inorganic material in an organic and inorganic sol-gel hybrid solution may be adjusted in order to reinforce strength or elasticity.

Also, in the case in which the functional coating layer 170 is formed so as to have a multilayer structure, it is preferable that the functional coating layer 170 formed at the front surface of the cover window 100 be made of a material having hardness gradually increasing toward the upper layer portion.

In addition, an anti-fingerprint (AF) or anti-reflective (AR) function may be imparted to the functional coating layer 170, particularly the uppermost layer portion of the functional coating layer 170. Resins having such a function may be combined, or various patterns, such as a moth-eye pattern, may be formed at the functional coating layer 170 to realize the function.

As described above, basically, the functional coating layer 170 is further formed at the cover window 100 according to the present invention in order to reinforce strength and elasticity based on use of the thin glass substrate 110, whereby it is possible to protect the cover window 100 against external shock or pressure of a stylus.

In addition, the functional coating layer 170 further prevents the occurrence of cracks at the folding region and reinforces elasticity of the cover window 100 at the surface thereof that abuts the display panel, whereby it is possible to improve shock resistance while performing a scattering prevention function.

Table 1 below shows pen-drop resistance properties and folding properties of a flexible cover window according to an embodiment of the present invention. A pen drop test was performed using a pen having a ball size of 0.5 mm and a weight of 6.2 g. The pen was freely dropped onto the front surface of the glass substrate from various heights to measure the height at which the cover window was broken. In a folding test, the radius of curvature (2 Point Bending R) when the cover window was broken at the time of folding the cover window by bending two points was measured.

TABLE 1

| Classification | Cylindrical patterns | Stripe patterns | Remarks |
| --- | --- | --- | --- |
| 2 Point Bending R | Avg R 1.68 | Avg R 2.28 | Thickness @ 0.08 mm |
| Pen drop | Avg 8 cm | Avg 6 cm | Thickness @ 0.08 mm |

In an embodiment of the present invention, as shown in FIG. 6, a shock compensation pattern unit having cylindrical patterns (height h2 of a second pattern at a folding portion=0.03 mm, height h3 of a third pattern at each of planar portions=0.015 mm, the size of each of the patterns=0.1 mm, and the distance between the patterns=0.1 mm) is formed at the folding portion and the planar portions on the rear surface of a glass substrate (thickness of 0.08t) (height h1 of the folding portion=0.048 mm), filling with an acrylic-based transparent resin material (thickness=0.01 mm) is performed, and an acrylic-based transparent resin (thickness=0.01 mm) is formed thereon.

In a comparative example of the present invention, stripe patterns (size of each of the patterns=0.1 mm and the distance between the patterns=0.1 mm) are formed at the entire surface of a glass substrate.

As can be seen from Table 1, the average of 2 Point Bending R values of the cylindrical patterns is 1.68 mm, whereas the average of 2 Point Bending R values of the stripe patterns is 2.28 mm. Consequently, it can be seen that the shock compensation pattern unit having the cylindrical patterns according to the embodiment of the present invention exhibits better folding properties than the shock compensation pattern unit having the stripe patterns.

In the pen drop test, the cover window is broken after pen drop from an average height of 8 cm for the cylindrical patterns, whereas the cover window is broken after pen drop from an average height of 6 cm for the stripe patterns. Consequently, it can be seen that the shock compensation pattern unit having the cylindrical patterns according to the embodiment of the present invention exhibits better pen-drop resistance properties than the shock compensation pattern unit having the stripe patterns.

In the flexible cover window according to the present invention, as described above, the shock compensation pattern unit having the cylindrical patterns is realized at the slimmed folding portion and the planar portions, whereby it is possible to reduce scratch percentage and to efficiently disperse shock, thereby improving pen-drop resistance properties, and therefore it is possible to provide a flexible cover window having secured strength and folding properties while having remarkably improved shock resistance.

As is apparent from the above description, the present invention relates to a flexible cover window, and more particularly to a flexible cover window having a shock compensation pattern unit formed on a glass substrate in order to disperse shock, whereby shock resistance of the flexible cover window is improved and strength and folding properties of the flexible cover window are secured.

That is, a folding portion and planar portions including a shock compensation pattern unit having cylindrical patterns are realized on the glass substrate, whereby at the time of pen drop, the shock is dispersed to the cylindrical patterns to increase resistance to pen drop, and therefore strength properties and folding properties are simultaneously satisfied.

Also, in the cover window according to the present invention, the shock compensation pattern unit is formed at the planar portions as well as the folding portion, whereby it is possible to reduce scratches on the surface of the glass substrate, and therefore it is possible to provide a high-quality flexible cover window.

In addition, the cover window according to the present invention is realized using a combination of glass and a resin material, whereby flexibility, restoring force, elastic force, and strength properties are reinforced by the resin material while texture of the glass is maximally maintained. In particular, the resin material absorbs shock, such as pen drop, whereby shock resistance is further improved. Consequently, it is possible to provide a flexible cover window made of a composite material, wherein shock resistance of the flexible cover window is further improved and the shock compensation pattern unit is not visible from outside.

In addition, a shock-absorbing resin layer is formed on the entire surface between glass substrates in order to absorb shock, such as pen drop, or to effectively transmit the shock outside, whereby pen-drop resistance properties are further improved.

Although the present invention has been described in detail based on concrete embodiments, those skilled in the art will appreciate that the present invention is not limited thereto and that various modifications, additions, and substitutions are possible without departing from the scope and spirit of the invention as disclosed in the accompanying claims.

What is claimed is:

1. A glass-based flexible cover window comprising planar portions formed so as to correspond to planar regions of a flexible display and a folding portion formed so as to be connected to the planar portions, the folding portion being formed so as to correspond to a folding region of the flexible display, the folding portion having a smaller thickness than each of the planar portions, wherein
the flexible cover window comprises:
a glass substrate; and
a shock compensation pattern unit formed on the glass substrate, and
the shock compensation pattern unit is formed at each of the planar portions and the folding portion, and the shock compensation pattern unit has cylindrical patterns,
wherein the shock compensation pattern unit is formed by etching the glass of the glass substrate.

2. The flexible cover window according to claim 1, wherein a diameter of each of the patterns of the shock compensation pattern unit is 0.08 mm to 0.15 mm, and a distance between the patterns is 0.05 mm to 0.12 mm.

3. The flexible cover window according to claim 1, wherein the shock compensation pattern unit is formed at one surface or opposite surfaces of the glass substrate.

4. The flexible cover window according to claim 1, wherein a height of each of the patterns of the shock compensation pattern unit formed at the folding portion is less than a depth of the folding portion.

5. The flexible cover window according to claim 1, wherein
the etching process comprises: a primary etching process of forming a first pattern at an entire surface of the glass substrate; and a secondary etching process of further etching the folding region to form a second pattern,
the shock compensation pattern unit formed at the folding portion is realized by the second pattern, and
the shock compensation pattern unit formed at each of the planar portions is realized by the first pattern.

6. The flexible cover window according to claim 1, wherein
the etching process comprises: a primary etching process of forming a first pattern at the folding portion; and a secondary etching process of etching an entire surface of the glass substrate to form a second pattern at the first pattern region as a result of further etching of the first pattern and to form a third pattern at each of the planar portions,
the shock compensation pattern unit formed at the folding portion is realized by the second pattern, and
the shock compensation pattern unit formed at each of the planar portions is realized by the third pattern.

7. The flexible cover window according to claim 5, wherein an etching depth according to the primary etching process is 0.0005 to 0.28 mm.

8. The flexible cover window according to claim 5, wherein an etching depth according to the secondary etching process is 0.01 to 0.2 mm.

9. The flexible cover window according to claim 1, wherein the folding portion has an inclined portion formed at a border with each of the planar portions.

10. The flexible cover window according to claim 1, wherein the patterns of the shock compensation pattern unit are regularly or irregularly formed so as to have an identical size or different sizes.

11. The flexible cover window according to claim 10, wherein the patterns of the shock compensation pattern unit are realized so as to have a lattice array or a cross array.

12. The flexible cover window according to claim 11, wherein
pattern density of the shock compensation pattern unit formed at the folding portion and pattern density of the shock compensation pattern unit formed at each of the planar portions are equal to each other, or
pattern density of the shock compensation pattern unit formed at the folding portion is higher than pattern density of the shock compensation pattern unit formed at each of the planar portions.

13. The flexible cover window according to claim 1, further comprising:
a shock-absorbing resin layer formed at a front surface of the glass substrate, at which the shock compensation pattern unit is formed; and
a cover glass substrate formed on the shock-absorbing resin layer.

14. The flexible cover window according to claim 13, wherein the patterns of the shock compensation pattern unit are filled with a transparent resin material.

15. The flexible cover window according to claim 14, wherein
a transparent resin layer is formed on the transparent resin material above the shock compensation pattern unit, and
the transparent resin material and the transparent resin layer are successively formed through an identical process using an identical material, or
the transparent resin material and the transparent resin layer are successively formed through sequential processes using an identical material or different materials.

16. The flexible cover window according to claim 15, wherein the transparent resin layer is formed:
at the front surface and a rear surface of the glass substrate; or
at the front surface, the rear surface, and an entire side surface of the glass substrate.

17. The flexible cover window according to claim 16, wherein
the transparent resin layer formed at the rear surface of the glass substrate and the transparent resin layer formed at the front surface of the glass substrate are made of an identical material, or
the transparent resin layer formed at the rear surface of the glass substrate is made of a softer material than the transparent resin layer formed at the front surface of the glass substrate.

18. A method of manufacturing the glass-based flexible cover window according to claim 1, the method comprising:
a first step of forming a resist layer on the glass substrate;
a second step of patterning the resist layer to form a resist pattern layer for formation of a first pattern on an entire surface or a folding region of the glass substrate;
a third step of performing a primary etching process using the resist pattern layer of the second step as a mask to form a first pattern on the entire surface or the folding region of the glass substrate and removing the resist pattern layer;
a fourth step of forming a resist layer on the glass substrate having the first pattern formed thereon;
a fifth step of patterning the resist layer to form a resist pattern layer for formation of a second pattern on the folding region or to form a resist pattern layer for formation of a second pattern on the folding region and for formation of a third pattern on planar regions of the glass substrate;
a sixth step of performing a secondary etching process using the resist pattern layer of the fifth step as a mask to further etch the folding region, thereby forming a second pattern at the folding region, or to etch the entire surface of the glass substrate, thereby forming a second pattern at the folding region and forming a third pattern at the planar regions, and removing the resist pattern layer; and
a seventh step of strengthening the glass substrate, whereby
the shock compensation pattern unit is formed at the folding portion and the planar portions and the folding portion has a smaller thickness than each of the planar portions.

19. The method according to claim 18, wherein a size of each of the patterns constituting the shock compensation pattern unit is 0.08 to 0.15 mm, and a distance between the patterns constituting the shock compensation pattern unit is 0.05 to 0.12 mm.

20. The method according to claim 18, wherein the resist pattern layer is realized as:
a compensation pattern layer for formation of the first pattern, the second pattern, and the third pattern; or
a compensation pattern layer for formation of the first pattern, the second pattern, and the third pattern and a gradation pattern layer for formation of inclined portions at a border of the first pattern and a border between the second pattern and the third pattern.

21. The method according to claim 18, wherein the shock compensation pattern unit is formed at one surface or opposite surfaces of the glass substrate.

22. The method according to claim 18, wherein an etching depth according to the primary etching process is 0.0005 to 0.28 mm.

23. The method according to claim 18, wherein an etching depth according to the secondary etching process is 0.01 to 0.2 mm.

24. The method according to claim 18, wherein the patterns of the shock compensation pattern unit are regularly or irregularly formed so as to have an identical size or different sizes.

25. The method according to claim 24, wherein the patterns of the shock compensation pattern unit are realized so as to have a lattice array or a cross array.

26. The method according to claim 25, wherein
pattern density of the shock compensation pattern unit formed at the folding portion and pattern density of the shock compensation pattern unit formed at each of the planar portions are equal to each other, or
pattern density of the shock compensation pattern unit formed at the folding portion is higher than pattern density of the shock compensation pattern unit formed at each of the planar portions.

27. The method according to claim 18, wherein the flexible cover window further comprises:
- a shock-absorbing resin layer formed at a front surface of the glass substrate, at which the shock compensation pattern unit is formed; and
- a cover glass substrate formed on the shock-absorbing resin layer.

28. The method according to claim 18, wherein the patterns of the shock compensation pattern unit are filled with a transparent resin material.

29. The method according to claim 28, wherein
- a transparent resin layer is formed on the transparent resin material above the shock compensation pattern unit, and
  - the transparent resin material and the transparent resin layer are successively formed through an identical process using an identical material, or
  - the transparent resin material and the transparent resin layer are successively formed through sequential processes using an identical material or different materials.

30. The method according to claim 29, wherein the transparent resin layer is formed:
- at a front surface and a rear surface of the glass substrate; or
- at the front surface, the rear surface, and an entire side surface of the glass substrate.

31. The method according to claim 30, wherein
- the transparent resin layer formed at the rear surface of the glass substrate and the transparent resin layer formed at the front surface of the glass substrate are made of an identical material, or
- the transparent resin layer formed at the rear surface of the glass substrate is made of a softer material than the transparent resin layer formed at the front surface of the glass substrate.

32. The flexible cover window according to claim 6, wherein an etching depth according to the primary etching process is 0.0005 to 0.28 mm.

33. The flexible cover window according to claim 6, wherein an etching depth according to the secondary etching process is 0.01 to 0.2 mm.

* * * * *